(12) United States Patent
Kim et al.

(10) Patent No.: US 11,295,986 B2
(45) Date of Patent: Apr. 5, 2022

(54) VERTICAL FIELD-EFFECT TRANSISTOR (VFET) DEVICES AND METHODS OF FORMING THE SAME

(71) Applicant: Samsung Electronics Co., Ltd., Suwon-si (KR)

(72) Inventors: Min Gyu Kim, Hwaseong-si (KR); Sa Hwan Hong, Yongin-si (KR)

(73) Assignee: Samsung Electronics Co., Ltd.

( * ) Notice: Subject to any disclaimer, the term of this patent is extended or adjusted under 35 U.S.C. 154(b) by 56 days.

(21) Appl. No.: 16/724,702

(22) Filed: Dec. 23, 2019

(65) Prior Publication Data

US 2020/0357701 A1 Nov. 12, 2020

Related U.S. Application Data

(60) Provisional application No. 62/845,924, filed on May 10, 2019.

(51) Int. Cl.
*H01L 21/8234* (2006.01)

(52) U.S. Cl.
CPC ........ *H01L 21/823487* (2013.01); *H01L 21/823412* (2013.01); *H01L 21/823418* (2013.01)

(58) Field of Classification Search
CPC ............ H01L 29/0847; H01L 29/7827; H01L 27/2454; H01L 29/78642; H01L 29/7828; H01L 29/66666
See application file for complete search history.

(56) References Cited

U.S. PATENT DOCUMENTS

| | | | |
|---|---|---|---|
| 7,241,655 B2 | 7/2007 | Tang et al. | |
| 9,620,509 B1 | 4/2017 | Pao et al. | |
| 9,627,511 B1 | 4/2017 | Cheng et al. | |
| 10,157,798 B1 | 12/2018 | Chi et al. | |
| 10,204,984 B1 | 2/2019 | Stoker et al. | |
| 10,229,985 B1 | 3/2019 | Li et al. | |
| 2020/0161451 A1* | 5/2020 | Lee .................. | H01L 29/42392 |
| 2020/0176611 A1* | 6/2020 | Lee ................ | H01L 21/823814 |

* cited by examiner

*Primary Examiner* — John A Bodnar
(74) *Attorney, Agent, or Firm* — Myers Bigel, P.A.

(57) ABSTRACT

Vertical field-effect transistor (VFET) devices and methods of forming the VFET devices are provided. The methods may include forming a first channel region and a second channel region on a substrate, forming a recess in the substrate between the first and second channel regions by removing a portion of the liner and a portion of the substrate, forming a bottom source/drain region in the recess of the substrate, forming a capping layer on the bottom source/drain region, removing the liner and the capping layer, forming a spacer on the substrate and the bottom source/drain region, and forming a gate structure on side surfaces of the first and second channel regions.

17 Claims, 14 Drawing Sheets

VERTICAL FIELD-EFFECT TRANSISTOR (VFET) DEVICES AND METHODS OF FORMING THE SAME

CROSS-REFERENCE TO RELATED APPLICATION

This application claims priority to U.S. Provisional Application Ser. No. 62/845,924, entitled VFET FLAT BOTTOM SPACER FORMATION USING CAPPING LAYER ON EPI FILM, filed in the USPTO on May 10, 2019, the disclosure of which is hereby incorporated by reference herein in its entirety.

FIELD

The present disclosure generally relates to the field of electronics and, more particularly, to vertical field-effect transistor (VFET) devices.

BACKGROUND

Various structures and manufacturing processes of VFET devices have been researched because of high scalability of VFET devices. Manufacturing processes of VFET devices may deteriorate performance by increasing the distance between a bottom source/drain region and a gate structure.

SUMMARY

According to some embodiments of the present inventive concept, methods of forming a VFET device may include forming a first channel region and a second channel region on a substrate, forming a recess in the substrate between the first and second channel regions by removing a portion of the liner and a portion of the substrate, forming a bottom source/drain region in the recess of the substrate, forming a capping layer on the bottom source/drain region, removing the liner and the capping layer, forming a spacer on the substrate and the bottom source/drain region, and forming a gate structure on side surfaces of the first and second channel regions. The first and second channel regions may protrude from the substrate, and the spacer may extend between the gate structure and the substrate.

According to some embodiments of the present inventive concept, methods of forming a VFET device may include forming a first channel region and a second channel region, forming a liner on the substrate and side surfaces of the first and second channel regions, forming a recess in the substrate between the first and second channel regions by removing a portion of the liner and a portion of the substrate, and forming a bottom source/drain region in the recess of the substrate. The first and second channel regions may protrude from a substrate. The bottom source/drain region may include an upper surface that is exposed by the substrate. The methods may also include removing the liner. Removing the liner may not change a profile of the upper surface of the bottom source/drain region and may expose the side surfaces of the first and second channel regions. The methods may further include forming a spacer on the substrate and the bottom source/drain region after removing the liner, and forming a gate structure on the side surfaces of the first and second channel regions. The spacer may extend between the gate structure and the substrate.

According to some embodiments of the present inventive concept, methods of forming a VFET device may include forming a first channel region and a second channel region, forming a bottom source/drain region in the substrate between the first and second channel regions, forming a spacer on the substrate and the bottom source/drain region, and forming a gate structure on the side surfaces of the first and second channel regions. The first and second channel regions may protrude from a substrate. The bottom source/drain region may include an upper surface exposed by the substrate, and the upper surface of the bottom source/drain region may be free of a recess. The spacer may have a unitary structure and may contact side surfaces of the first and second channel regions. The spacer may extend between the gate structure and the substrate.

DETAILED DESCRIPTION

Figure 1:
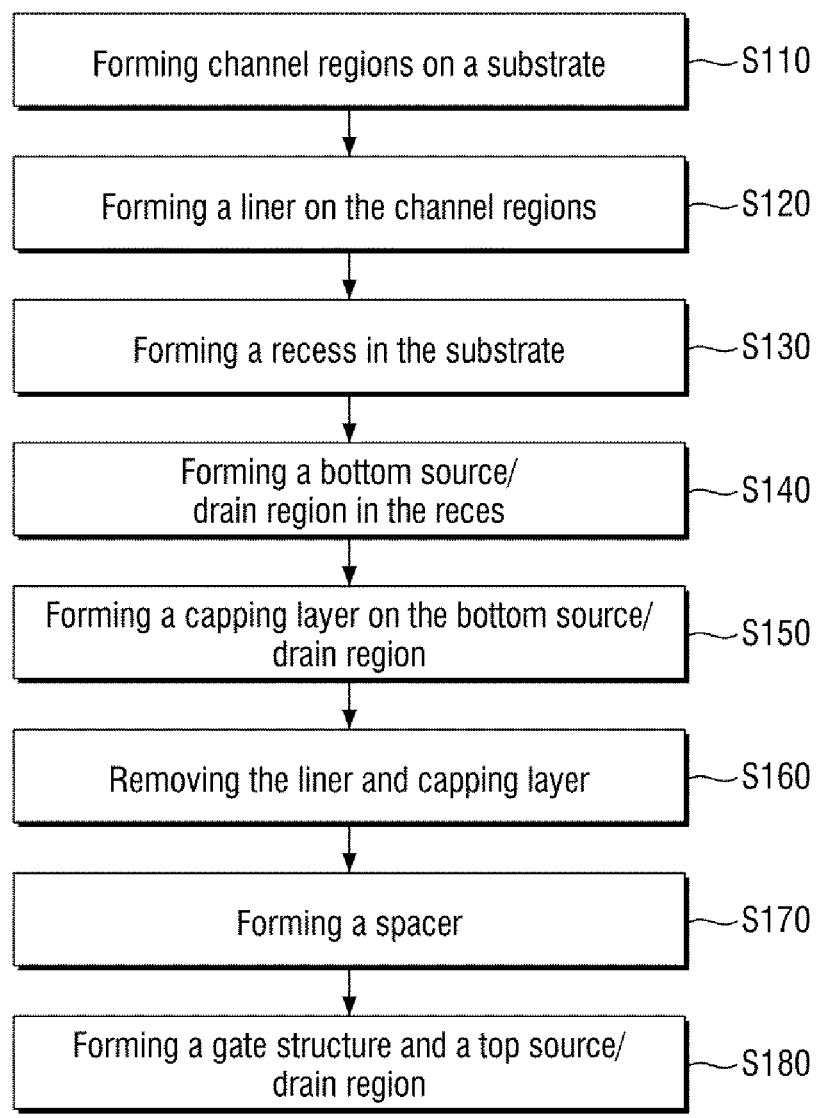
FIG. 1 is a flow chart illustrating methods of forming a VFET device according to some embodiments of the present inventive concept.

Example embodiments are described below with reference to the accompanying drawings. Many different forms and embodiments are possible without deviating from the spirit and teachings of the present inventive concept, and so the disclosure should not be construed as limited to the example embodiments set forth herein. Rather, these example embodiments are provided so that this disclosure will be thorough and complete and will convey the scope of the present inventive concept to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

During manufacturing processes of VFET devices, an upper surface of a bottom source/drain region may be partially removed, and a recess may be formed in the upper surface of the bottom source/drain region. The recess in the upper surface of the bottom source/drain region may change (e.g., increase) a distance between the bottom source/drain region and a gate structure and thus may deteriorate performance of VFET devices.

FIG. 1 is a flow chart illustrating methods of forming a VFET device according to some embodiments of the present inventive concept. FIGS. 2 through 8 are cross-sectional views illustrating methods of forming a VFET device according to some embodiments of the present inventive concept.

Figure 2:
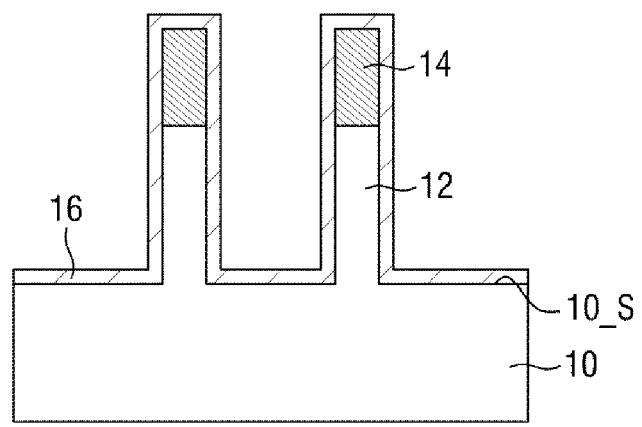
FIGS. 2 through 8 are cross-sectional views illustrating methods of forming a VFET device according to some embodiments of the present inventive concept.
Figure 3:
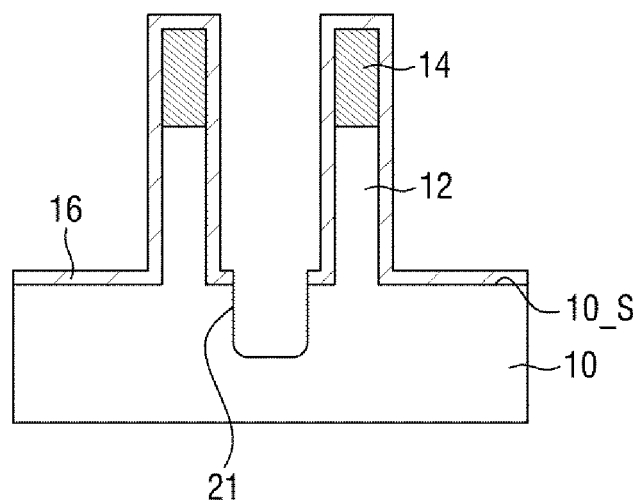

Referring to FIGS. 1 through 3, the methods may include forming channel regions 12 (S110) that protrude from a substrate 10 (e.g., from an upper surface 10_S of the substrate 10). Each of the channel regions 12 may protrude in a vertical direction that may be perpendicular to the upper surface 10_S of the substrate 10. In some embodiments, forming the channel regions 12 may include forming mask layers 14 on the substrate 10 and etching the substrate 10 using the mask layers 14 as an etch mask to form the channel regions 12. Accordingly, the channel regions 12 may be portions of the substrate 10. In some embodiments, the mask layers 14 may remain on the channel regions 12 after forming the channel regions 12 as illustrated in FIG. 2. For example, the mask layers 14 may be hard mask layers. In some embodiments, the mask layers 14 may be omitted. For example, forming the channel regions 12 may include performing a selective epitaxial growth process using the substrate 10 as a seed layer, without using the mask layers 14.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

Referring to FIGS. 1 and 2, the methods may include forming a protecting layer 16 (S120) on the channel regions 12 and the substrate 10. In some embodiments, the protecting layer 16 may have a uniform thickness along surfaces (e.g., side surfaces) of the channel regions 12 and the upper surface 10_S of the substrate 10 but the present inventive concept is not limited thereto. In some embodiments, the protecting layer 16 may have a first thickness on a side of the channel regions 12 that is thicker than a second thickness of the protecting layer 16 on the upper surface 10_S of the substrate 10. The protecting layer 16 may include a material different from the substrate 10 and may have an etch selectivity with respect to the substrate 10. For example, the protecting layer 16 may include a silicon nitride layer and/or silicon oxynitride layer.

It will be understood that the protecting layer 16 may be referred to as a liner or a protecting liner as the protecting layer 16 has a line shape that extends along the surfaces of the channel regions 12 and the upper surface 10_S of the substrate 10. In some embodiments, the protecting layer 16 may contact the surfaces of the channel regions 12 and the upper surface 10_S of the substrate 10.

Referring to FIGS. 1 and 3, a portion of the protecting layer 16 and a portion of the substrate 10 may be removed to form a recess 21 in the substrate 10 between the channel regions 12 (S130). Removing the portion of the protecting layer 16 and the portion of the substrate 10 may be performed by one or more of various processes including, for example, a dry etching process and/or a wet etching process. Although not shown, it will be understood that a mask layer may be formed to selectively remove the portion of the protecting layer 16 and the portion of the substrate 10.

Figure 4:
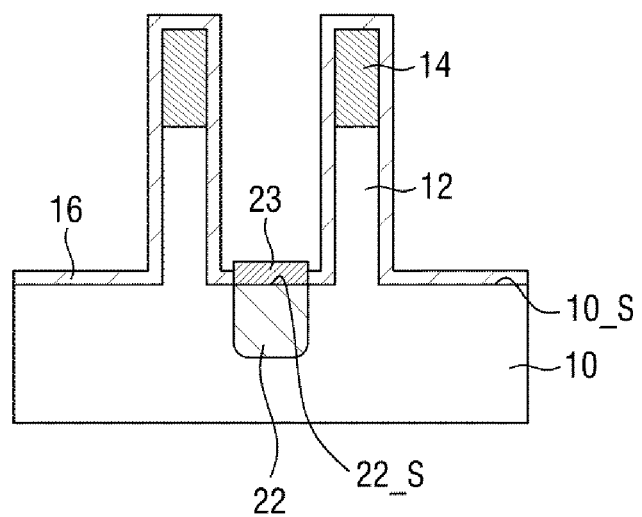

Referring to FIGS. 1 and 4, the methods may include forming a bottom source/drain region 22 in the recess 21 (S140) and forming a capping layer 23 on an upper surface 22_S of the bottom source/drain region 22 (S150). The substrate 10 may not cover the upper surface 22_S of the bottom source/drain region 22, and thus the upper surface 22_S of the bottom source/drain region 22 may be exposed by the substrate 10. The upper surface 22_S of the bottom source/drain region 22 may remain exposed until the capping layer 23 is formed thereon. In some embodiments, a lower surface of the capping layer 23 may contact the upper surface 22_S of the bottom source/drain region 22 as illustrated in FIG. 4. For example, the bottom source/drain region 22 may include a semiconductor material including first dopants.

The capping layer 23 may include a material different from the protecting layer 16 and may have an etch selectivity with respect to the protecting layer 16. The capping layer 23, therefore, may cover and/or protect the upper surface 22_S of the bottom source/drain region 22 while removing the protecting layer 16 during a subsequent process.

For example, the capping layer 23 may include an undoped semiconductor layer (e.g., an undoped silicon layer) and/or a semiconductor layer including second dopants (e.g., a silicon layer including phosphorous). It will be understood that the undoped semiconductor layer may be free of dopants intentionally added thereinto and may be substantially free of dopants. However, it will be also understood that the undoped semiconductor layer is not necessarily free of unintentionally added dopants. In some embodiments, the undoped semiconductor layer may include dopants from adjacent elements by, for example, diffusion of the dopants.

When the capping layer 23 includes a doped semiconductor layer, a dopant concentration of the semiconductor layer of the capping layer 23 may be lower than a dopant concentration of the bottom source/drain region 22. In some embodiments, the dopant concentration of the semiconductor layer of the capping layer 23 may be less than 15% of the dopant concentration of the bottom source/drain region 22. For example, the dopant concentration of the semiconductor layer of the capping layer 23 may be around 7% of the dopant concentration of the bottom source/drain region 22. For example, the dopant concentration of the semiconductor layer of the capping layer 23 may be about 1E20 atoms/cm$^3$.

In some embodiments, the bottom source/drain region 22 may be formed by performing an epitaxial growth process (e.g., a selective epitaxial growth process) using a surface of the recess 21 as a seed layer. In some embodiments, the capping layer 23 may be formed by performing an epitaxial growth process (e.g., a selective epitaxial growth process) using the bottom source/drain region 22 as a seed layer.

In some embodiments, the bottom source/drain region 22 and the capping layer 23 may be formed in the same equipment and/or in the same chamber and thus may be referred to as being formed in-situ. In some embodiments, the capping layer 23 may be formed on the bottom source/drain region 22 without exposing the bottom source/drain region 22 to outside of the equipment. In some embodiments, the capping layer 23 may be formed on the bottom source/drain region 22 immediately after (e.g., within 10 seconds of) forming the bottom source/drain region 22.

In some embodiments, a thickness of the capping layer 23 in the vertical direction may be uniform as illustrated in FIG. 4. Although FIG. 4 shows that an upper surface of the capping layer 23 protrudes in the vertical direction beyond an upper surface of a portion of the protecting layer 16 adjacent thereto that contacts the upper surface 10_S of the substrate 10, the present inventive concept is not limited thereto. In some embodiments, the upper surface of the capping layer 23 may be recessed toward the substrate 10 relative to the upper surface of the portion of the protecting layer 16 adjacent to capping layer 23.

Figure 5:
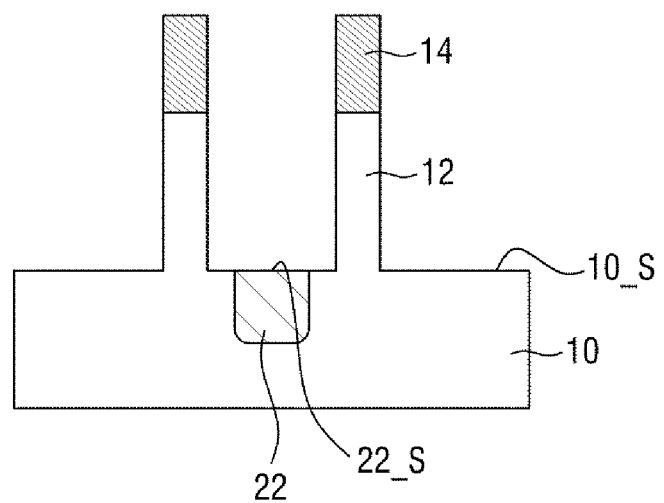
Figure 6:
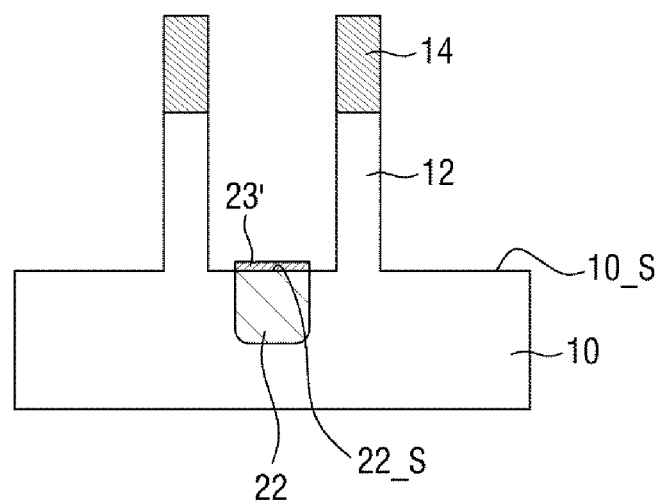

Referring to FIGS. 1, 5 and 6, the methods may include removing the protecting layer 16 and the capping layer 23 (S160). Removing the protecting layer 16 and the capping layer 23 may expose sides of the channel regions 12. In some embodiments, the sides of the channel regions 12 may be completely exposed by removing the protecting layer 16 and the capping layer 23 as illustrated in FIGS. 5 and 6. In some embodiments, only an upper portion of the capping layer 23 may be removed and thus a lower portion 23' of the capping layer 23 may remain on the bottom source/drain region 22 as illustrated in FIG. 6. In some embodiments, when the channel regions 12 are spaced apart from each other by about 40 nm or more, only an upper portion of the capping layer 23 may be removed.

Removing the protecting layer 16 and the capping layer 23 may be performed by one or more of various processes including, for example, a dry etching process and/or a wet etching process. In some embodiments, removing the protecting layer 16 and the capping layer 23 may not change a profile of the upper surface 22_S of the bottom source/drain region 22. For example, removing the protecting layer 16 and the capping layer 23 may not remove the bottom source/drain region 22. In some embodiments, removing the protecting layer 16 and the capping layer 23 may not form a recess in the upper surface 22_S of the bottom source/drain region 22, and the upper surface 22_S of the bottom source/drain region 22 may remain flat as illustrated in FIGS. 5 and 6. Accordingly, the bottom source/drain region 22 may be spaced apart from an overlying gate structure (e.g., a gate structure 35 in FIGS. 7 and 8) by a uniform distance and may maintain a relative close distance to the gate structure.

Figure 7:
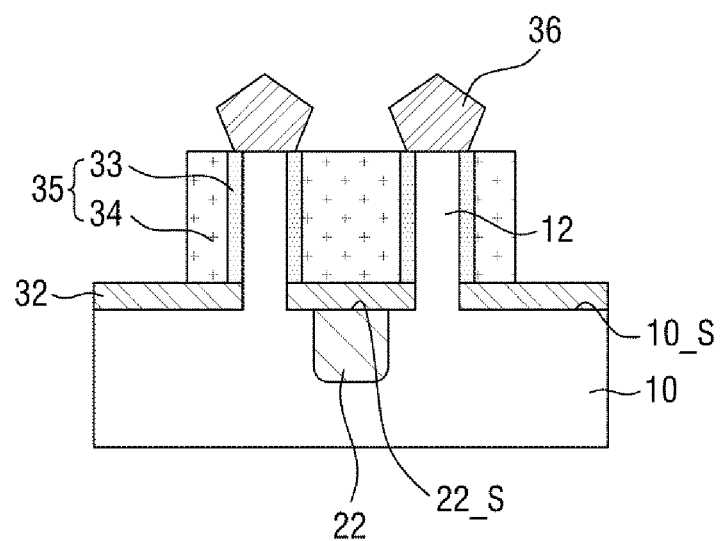
Figure 8:
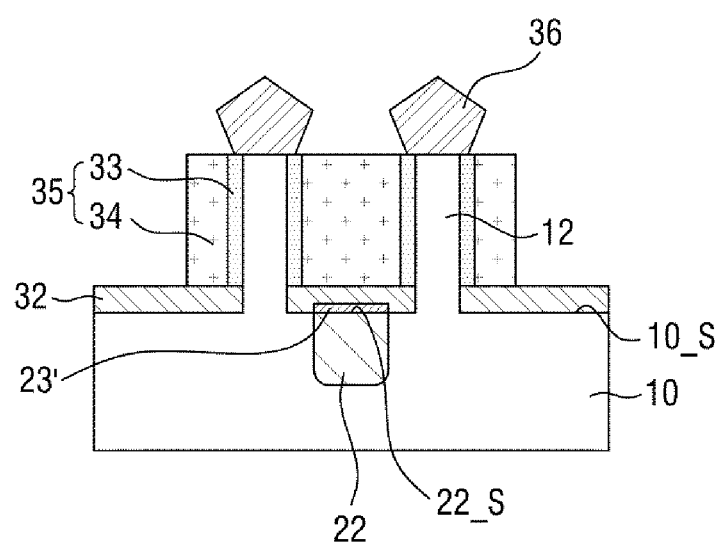

Referring to FIGS. 1, 7 and 8, the methods may include forming a spacer 32 on the substrate 10 and the bottom source/drain region 22 (S170) and forming a gate structure 35 and top source/drain regions 36 on the spacer 32 (S180). In some embodiments, the spacer 32 may be formed on the lower portion 23' of the capping layer 23 as illustrated in FIG. 8.

In some embodiments, the spacer 32 may contact the lower portion 23' of the capping layer 23. The spacer 32 may extend between the substrate 10 and the gate structure 35 and thus may separate the gate structure 35 from the substrate 10. In some embodiments, the spacer 32 may not include a portion protruding into the bottom source/drain region 22, and a portion of a lower surface of the spacer 32 facing the bottom source/drain region 22 may be flat as illustrated in FIGS. 7 and 8.

The spacer 32 may include an insulating material and may electrically isolate the gate structure 35 from the substrate 10 and the bottom source/drain region 22. The spacer 32 may contact the sides of the channel regions 12 (e.g., lower portions of the sides of the channel regions 12) as illustrated in FIGS. 7 and 8 and may have a unitary structure. It will be understood that the term "unitary structure" refers to a structure that is formed by the same process and/or is free of an interface between two layers formed by different processes.

The spacer 32 may include, for example, silicon oxide, silicon nitride, and/or silicon oxynitride. In some embodiments, the spacer 32 may be formed by performing a directional deposition process, such as, for example, a gas clustering ion beam (GCIB) deposition process or High Density Plasma Chemical Vapor Deposition (HDPCVD) process. Accordingly, in some embodiments, the spacer 32 may not be formed on upper portions of the channel regions 12 on which the gate structure 35 is formed.

Still referring to FIGS. 7 and 8, the gate structure 35 may be formed on the spacer 32 and on the sides of the channel regions 12. The gate structure 35 may include multiple layers that are sequentially stacked on the sides of the channel regions 12. For example, a gate insulator, a work-function regulating layer, a diffusion barrier layer, an etch stop layer, and/or a conductive gate electrode. For example, the gate structure 35 may include a gate insulator 33 and a conductive gate electrode 34.

The methods may include forming top source/drain regions 36 on the channel regions 12 by performing one or more of various processes. In some embodiments, the top source/drain regions 36 may be formed by performing an epitaxial growth process (e.g., a selective epitaxial growth process) using the channel regions 12 as a seed layer.

FIGS. 9 through 14 are cross-sectional views illustrating methods of forming a VFET device according to some embodiments of the present inventive concept. For convenience of explanation, the description will focus on differences from the methods of forming the VFET device according to some embodiments of the present inventive concept described above.

Figure 9:
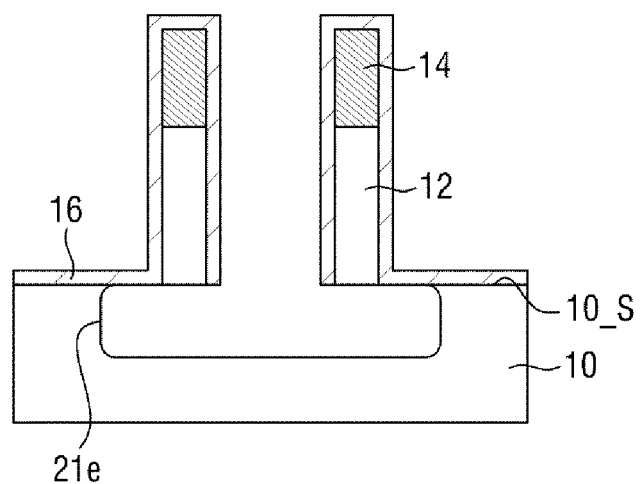
FIGS. 9 through 14 are cross-sectional views illustrating methods of forming a VFET device according to some embodiments of the present inventive concept.

Referring to FIGS. 1 and 9, the methods may include forming an enlarged recess 21e under the channel regions 12 (S130). The enlarged recess 21e may expose entire lower surfaces of the channel regions 12. The enlarged recess 21e may be formed by performing one or more of various processes including, for example, a dry etching process and/or a wet etching process.

Figure 10:
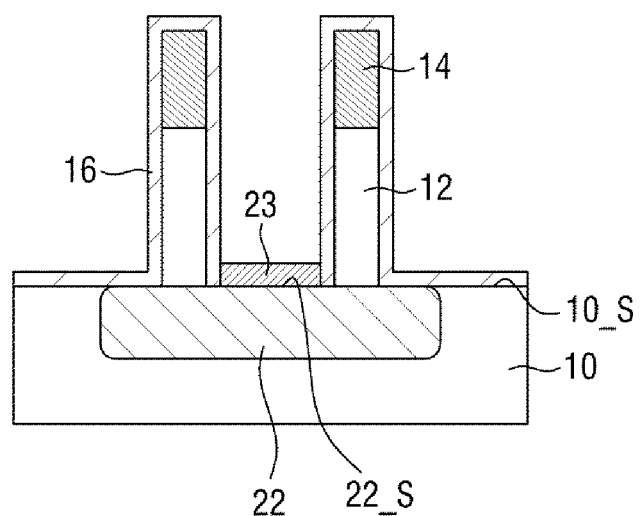

Referring to FIGS. 1 and 10, the methods may include forming a bottom source/drain region 22 in the enlarged recess 21e (S140) and forming a capping layer 23 on an upper surface 22_S of the bottom source/drain region 22 (S150).

Figure 11:
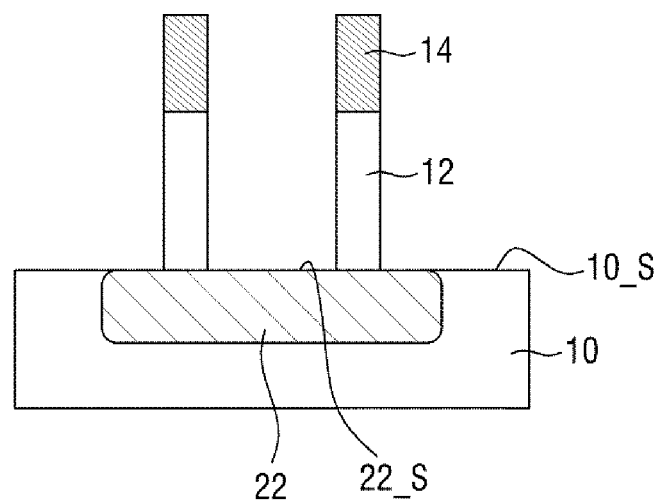
Figure 12:
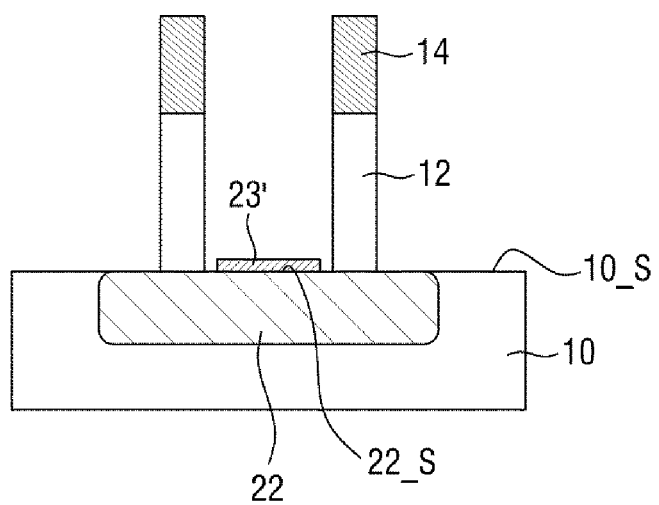

Referring to FIGS. 1, 11 and 12, the methods may include removing the protecting layer 16 and the capping layer 23 (S160). Removing the protecting layer 16 and the capping layer 23 may expose sides of the channel regions 12. In some embodiments, the sides of the channel regions 12 may be completely exposed by removing the protecting layer 16 and the capping layer 23 as illustrated in FIGS. 11 and 12. In some embodiments, only an upper portion of the capping layer 23 may be removed and thus a lower portion 23' of the capping layer 23 may remain on the bottom source/drain region 22 as illustrated in FIG. 12.

In some embodiments, removing the protecting layer 16 and the capping layer 23 may not change a profile of the upper surface 22_S of the bottom source/drain region 22. For example, removing the protecting layer 16 and the capping layer 23 may not remove the bottom source/drain region 22. In some embodiments, removing the protecting layer 16 and the capping layer 23 may not form a recess in the upper surface 22_S of the bottom source/drain region 22, and the upper surface 22_S of the bottom source/drain region 22 may remain flat as illustrated in FIGS. 11 and 12.

Figure 13:
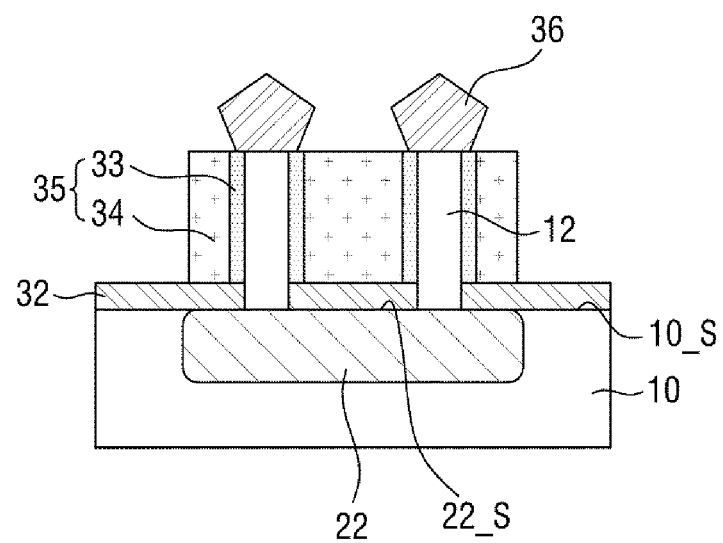
Figure 14:
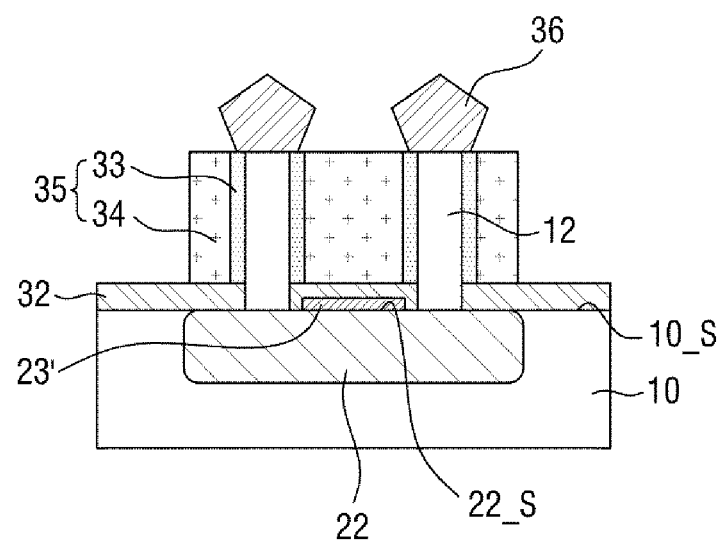

Referring to FIGS. 1, 13, and 14, the methods may include forming a spacer 32 on the substrate 10 and the bottom source/drain region 22 (S170) and forming a gate structure 35 on the spacer 32 (S180). In some embodiments, the spacer 32 may be formed on the lower portion 23' of the capping layer 23 as illustrated in FIG. 14.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a vertical field-effect transistor (VFET) device, the method comprising:
    forming a first channel region and a second channel region on a substrate, wherein the first and second channel regions protrude from the substrate;
    forming a liner on the substrate and the first and second channel regions;
    forming a recess in the substrate between the first and second channel regions by removing a portion of the liner and a portion of the substrate;
    forming a bottom source/drain region in the recess of the substrate;
    forming a capping layer on the bottom source/drain region, the capping layer comprising a semiconductor layer;
    removing the liner and the capping layer;
    forming a spacer on the substrate and the bottom source/drain region; and
    forming a gate structure on side surfaces of the first and second channel regions, wherein the spacer extends between the gate structure and the substrate.

2. The method of claim 1, wherein forming the capping layer comprises performing an epitaxial growth process using the bottom source/drain region as a seed layer.

3. The method of claim 2, wherein the semiconductor layer of the capping layer comprises an undoped semiconductor layer or a doped semiconductor layer that has a dopant concentration less than 15% of a dopant concentration of the bottom source/drain region.

4. The method of claim 1, wherein the capping layer comprises a material different from the liner.

5. The method of claim 1, wherein removing the liner and the capping layer comprises removing an upper portion of the capping layer and leaving a lower portion of the capping layer, and
    wherein forming the spacer comprises forming a portion of the spacer contacting the lower portion of the capping layer.

6. The method of claim 1, wherein removing the liner and the capping layer does not change a profile of an upper surface of the bottom source/drain region.

7. The method of claim 1, wherein forming the spacer comprises forming the spacer contacting the side surfaces of the first and second channel regions.

8. The method of claim 7, wherein forming the spacer comprises forming the spacer having a unitary structure.

9. The method of claim 1, wherein forming the spacer comprises forming the spacer to not protrude into the bottom source/drain region.

10. The method of claim 1, wherein forming the bottom source/drain region comprises forming the bottom source/drain region comprising an upper surface that is exposed by the substrate, and
    wherein the upper surface of the bottom source/drain region is free of a recess.

11. A method of forming a vertical field-effect transistor (VFET) device, the method comprising:
    forming a first channel region and a second channel region, wherein the first and second channel regions protrude from a substrate;
    forming a liner on the substrate and side surfaces of the first and second channel regions;
    forming a recess in the substrate between the first and second channel regions by removing a portion of the liner and a portion of the substrate;
    forming a bottom source/drain region in the recess of the substrate, wherein the bottom source/drain region comprises an upper surface that is exposed by the substrate;
    forming a capping layer contacting the upper surface of the bottom source/drain region;
    removing the liner, wherein at least a portion of the capping layer is removed while removing the liner, and removing the liner does not change a profile of the upper surface of the bottom source/drain region and exposes the side surfaces of the first and second channel regions;
    forming a spacer on the substrate and the bottom source/drain region after removing the liner; and
    forming a gate structure on the side surfaces of the first and second channel regions, wherein the spacer extends between the gate structure and the substrate, and
    wherein the capping layer comprises an undoped semiconductor layer or a doped semiconductor layer that has a dopant concentration less than 15% of a dopant concentration of the bottom source/drain region.

12. The method of claim 11, wherein removing the liner does not form a recess in the upper surface of the bottom source/drain region.

13. The method of claim 11, wherein the spacer does not include a protruding portion protruding into the bottom source/drain region.

14. The method of claim 11, wherein removing the liner exposes the upper surface of the bottom source/drain region.

15. The method of claim 11, wherein removing the liner comprises removing an upper portion of the capping layer and leaving a lower portion of the capping layer, and
  wherein forming the spacer comprises forming a portion of the spacer contacting the lower portion of the capping layer.

16. A method of forming a vertical field-effect transistor (VFET) device, the method comprising:
  forming a first channel region and a second channel region, wherein the first and second channel regions protrude from a substrate;
  forming a bottom source/drain region in the substrate between the first and second channel regions, wherein the bottom source/drain region comprises a semiconductor layer that defines an upper surface of the bottom source/drain region;
  forming a spacer on the substrate and the bottom source/drain region, wherein the spacer has a unitary structure and contacts side surfaces of the first and second channel regions, and the upper surface of the bottom source/drain region is free of a recess after the spacer is formed;
  forming a capping layer on the bottom source/drain region before forming the spacer; and
  forming a gate structure on the side surfaces of the first and second channel regions, wherein the spacer extends between the gate structure and the substrate, and
  wherein the capping layer comprises an undoped semiconductor layer or a doped semiconductor layer that has a dopant concentration less than 15% of a dopant concentration of the bottom source/drain region.

17. The method of claim 16, wherein forming the spacer comprises forming the spacer to not protrude into the bottom source/drain region.

* * * * *